United States Patent
Tocchio et al.

(10) Patent No.: US 11,835,541 B2
(45) Date of Patent: Dec. 5, 2023

(54) MEMS ACCELEROMETRIC SENSOR HAVING HIGH ACCURACY AND LOW SENSITIVITY TO TEMPERATURE AND AGING

(71) Applicant: STMICROELECTRONICS S.R.L., Agrate Brianza (IT)

(72) Inventors: Alessandro Tocchio, Milan (IT); Gabriele Gattere, Castronno (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 373 days.

(21) Appl. No.: 16/781,963

(22) Filed: Feb. 4, 2020

(65) Prior Publication Data
US 2020/0174035 A1    Jun. 4, 2020

Related U.S. Application Data

(62) Division of application No. 15/265,111, filed on Sep. 14, 2016, now Pat. No. 10,591,507.

(30) Foreign Application Priority Data

Mar. 31, 2016 (IT) .......................... 102016000033301

(51) Int. Cl.
*G01P 15/125* (2006.01)
*B81B 3/00* (2006.01)
*G01P 15/08* (2006.01)

(52) U.S. Cl.
CPC .......... *G01P 15/125* (2013.01); *B81B 3/0021* (2013.01); *B81B 2201/0235* (2013.01);
(Continued)

(58) Field of Classification Search
CPC ........... G01P 15/125; G01P 2015/0814; G01P 2015/0831; G01P 15/095; B81B 3/0021;
(Continued)

(56) References Cited

U.S. PATENT DOCUMENTS 5,783,973 A    7/1998 Weinberg et al.
6,164,134 A   12/2000 Cargille
(Continued)

FOREIGN PATENT DOCUMENTS

CN         1603842 A     4/2005
CN       101089624 A    12/2007
(Continued)

*Primary Examiner* — Kristina M Deherrera
*Assistant Examiner* — Monica S Young
(74) *Attorney, Agent, or Firm* — SEED IP LAW GROUP LLP

(57) ABSTRACT

A MEMS accelerometric sensor includes a bearing structure and a suspended region that is made of semiconductor material, mobile with respect to the bearing structure. At least one modulation electrode is fixed to the bearing structure and is biased with an electrical modulation signal including at least one periodic component having a first frequency. At least one variable capacitor is formed by the suspended region and by the modulation electrode in such a way that the suspended region is subjected to an electrostatic force that depends upon the electrical modulation signal. A sensing assembly generates, when the accelerometric sensor is subjected to an acceleration, an electrical sensing signal indicating the position of the suspended region with respect to the bearing structure and includes a frequency-modulated component that is a function of the acceleration and of the first frequency.

21 Claims, 4 Drawing Sheets

(52) U.S. Cl.
CPC ... *B81B 2203/0181* (2013.01); *B81B 2203/04* (2013.01); *G01P 2015/0814* (2013.01); *G01P 2015/0831* (2013.01)

(58) Field of Classification Search
CPC .... B81B 2201/0235; B81B 2203/0181; B81B 2203/04
USPC ...................................................... 73/514.32
See application file for complete search history.

(56) References Cited

U.S. PATENT DOCUMENTS

| | | | | |
|---|---|---|---|---|
| 6,845,670 | B1* | 1/2005 | McNeil | G01P 15/18 |
| | | | | 73/514.32 |
| 8,671,756 | B2* | 3/2014 | Comi | G01P 15/0888 |
| | | | | 73/514.29 |
| 9,541,574 | B2 | 1/2017 | Brisson et al. | |
| 2002/0095990 | A1 | 7/2002 | Ishikawa et al. | |
| 2009/0025477 | A1* | 1/2009 | Pilchowski | G01C 19/5719 |
| | | | | 73/514.15 |
| 2009/0031809 | A1 | 2/2009 | Lin et al. | |
| 2010/0116054 | A1 | 5/2010 | Paulson | |
| 2010/0154541 | A1* | 6/2010 | Cazzaniga | B81B 3/0018 |
| | | | | 73/504.12 |
| 2010/0300204 | A1* | 12/2010 | Reinmuth | G01P 15/125 |
| | | | | 73/514.32 |
| 2012/0132003 | A1* | 5/2012 | Comi | G01P 15/097 |
| | | | | 73/514.29 |
| 2012/0248931 | A1* | 10/2012 | Reinmuth | G01L 9/0005 |
| | | | | 310/300 |
| 2013/0104656 | A1* | 5/2013 | Smith | G01P 1/003 |
| | | | | 73/514.16 |
| 2014/0165691 | A1* | 6/2014 | Stewart | G01P 21/00 |
| | | | | 73/1.38 |
| 2014/0217929 | A1 | 8/2014 | Lin et al. | |
| 2014/0339654 | A1 | 11/2014 | Classen | |
| 2016/0003618 | A1* | 1/2016 | Boser | G01D 5/243 |
| | | | | 73/504.12 |
| 2017/0168085 | A1* | 6/2017 | Gafforelli | B81C 1/00698 |
| 2017/0285061 | A1* | 10/2017 | Tocchio | G01P 1/006 |
| 2017/0338842 | A1 | 11/2017 | Pratt | |

FOREIGN PATENT DOCUMENTS

| | | | | |
|---|---|---|---|---|
| CN | 101738496 | A | 6/2010 | |
| CN | 102032970 | A | 4/2011 | |
| CN | 102141575 | A | 8/2011 | |
| CN | 104345167 | A | 2/2015 | |
| DE | 10 2010 031214 | A1 | 1/2012 | |
| EP | 0 664 438 | A1 | 7/1995 | |
| EP | 2 746 780 | A1 | 6/2012 | |
| EP | 2 713 169 | A1 | 4/2014 | |
| EP | 2 775 309 | A1 | 9/2014 | |
| JP | 2010243479 | A * | 10/2010 | ......... G01C 19/5719 |
| WO | 2014/001634 | A1 | 1/2014 | |

* cited by examiner

MEMS ACCELEROMETRIC SENSOR HAVING HIGH ACCURACY AND LOW SENSITIVITY TO TEMPERATURE AND AGING

BACKGROUND

Technical Field

The present disclosure relates to an accelerometric sensor obtained using MEMS (Micro-Electro-Mechanical Systems) technology that has high accuracy and low sensitivity to temperature and aging.

Description of the Related Art

As is known, an accelerometric sensor or accelerometer is an inertial sensor that converts an acceleration into an electrical signal. An accelerometric sensor obtained using MEMS technology is basically made up of a mobile structure and a detection system, which is coupled to the mobile structure and generates a corresponding electrical signal (for example, a capacitive variation), which, in turn, is supplied to a processing interface.

For instance, the U.S. Pat. No. 8,671,756 describes a microelectromechanical sensing structure for a MEMS resonant biaxial accelerometer. The microelectromechanical sensing structure includes an inertial mass anchored to a substrate by means of elastic elements in such a way as to be suspended over the substrate. The elastic elements enable inertial sensing movements of the inertial mass along a first sensing axis and a second sensing axis that belong to a plane of main extension of the inertial mass, in response to respective linear external accelerations. Furthermore, the microelectromechanical sensing structure includes at least one first resonant element and one second resonant element, which have respective longitudinal extensions along the first and second sensing axes, and are mechanically coupled to the inertial mass via a corresponding elastic element, in such a way as to be subjected to a respective axial stress, when the inertial mass is displaced, respectively, along the first and second sensing axes.

In general, the accelerometers can be used in numerous applications. For example, they can form corresponding inclinometers. However, in numerous applications, it is required for the electrical signal supplied by the accelerometer to be particularly precise and accurate. In this connection, in some applications it is required for the so-called ZGO (zero-gravity offset) stability to be less than 0.00981 m/s$^2$.

In greater detail, accelerometers are subjected to undesirable phenomena, such as, for example, temperature variations, aging, mechanical stresses, etc. The aforesaid undesirable phenomena cause onset of spurious components within the electrical signals generated by the accelerometers, i.e., components not correlated with the accelerations to which the accelerometers are subjected, with consequent reduction of the accuracy of the accelerometers.

BRIEF SUMMARY

The present disclosure provides an accelerometric sensor, which, as compared to the prior art, has a low sensitivity to temperature and aging.

According to the present disclosure, an accelerometric sensor and a method for detecting an accelerometric signal are provided.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein.

DETAILED DESCRIPTION

Figure 1:
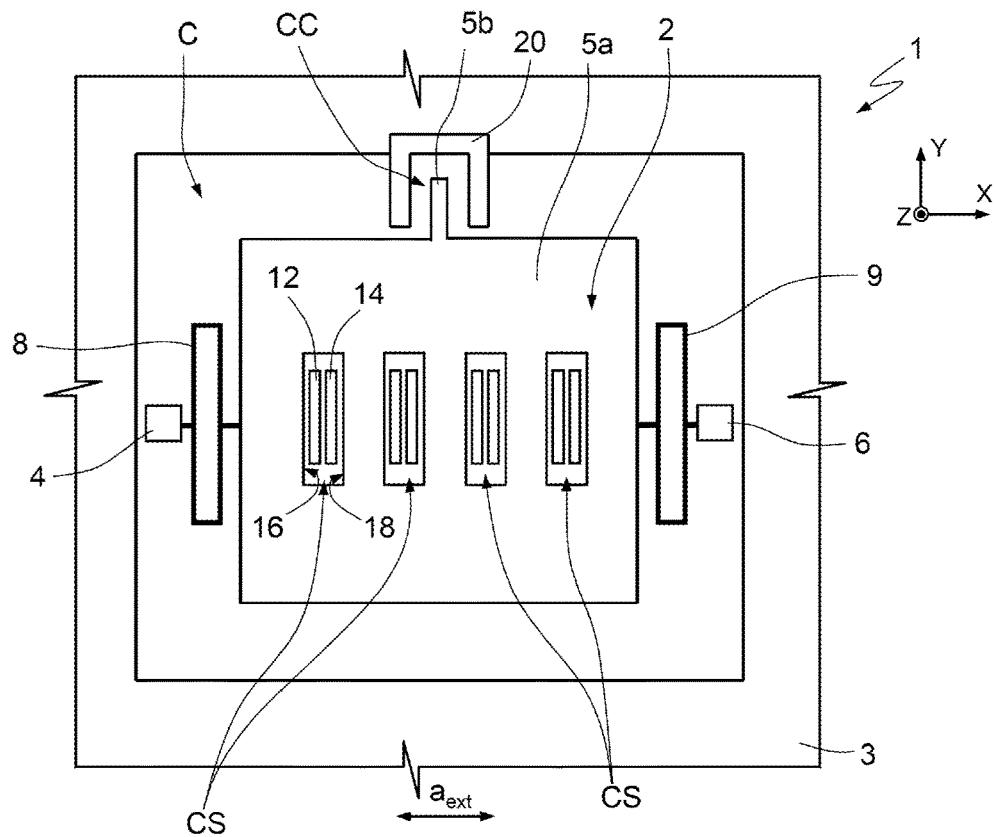
FIG. 1 shows a schematic top plan view of an embodiment of an accelerometer according to one embodiment of the present disclosure.

FIG. 1 is a schematic illustration of the structure of an embodiment of an accelerometer 1 that is designed to detect accelerations, manufactured in an integrated way using MEMS technology. In the example illustrated, the accelerometer 1 is configured to detect an acceleration, indicated by the arrow $a_{ext}$, directed parallel to an axis X of an orthogonal reference system XYZ.

The accelerometer 1 is formed in a die of semiconductor material and includes a suspended region 2 and a bearing structure 3, fixed with respect to the die and hence referred to hereinafter as "fixed region 3". Visible in FIG. 1 is only a portion of the fixed region 3, which surrounds the suspended region 2.

The fixed region 3 delimits a main cavity C, extending inside which is the suspended region 2.

The suspended region 2 includes a first portion 5a, which will be referred to in what follows as "main body 5a", and a second portion 5b, which will be referred to in what follows as "control element 5b". The main body 5a and the control element 5b are made of semiconductor material (for example, monocrystalline or polycrystalline silicon). More in particular, the main body 5a and the control element 5b are provided in one and the same layer of semiconductor material and are monolithic with, and hence fixed with respect to, one another.

The main body 5a is constrained to the fixed region 3 via a first anchorage 4 and a second anchorage 6, as well as via a first elastic suspension element 8 and a second elastic suspension element 9, which are also referred to as "first and second springs" and function as translational springs.

In greater detail, in the example illustrated in FIG. 1, the main body 5a has a rectangular shape in top plan view (in the plane XY), with sides parallel to the axes X and Y. Moreover, the main body 5a has a thickness (measured parallel to the axis Z, perpendicular to the plane of the drawing) smaller than the dimensions in the directions parallel to the axes X and Y. In other words, the plane XY is parallel to a surface of main extension of the main body 5a of the suspended region 2. For instance, the thickness of the main body 5a of the suspended region 2 may be in the region of 20-30 μm. In the example illustrated in FIG. 1, the control element 5b has the same thickness as the main body 5a and is coplanar with the latter.

Each of the first and second anchorages 4, 6 is substantially formed by a column, which extends in the direction perpendicular to the plane of the drawing (i.e., parallel to the axis Z), starting from a substrate (not visible), which forms part of the fixed region 3 and which extends underneath the suspended region 2. In addition, in top plan view, the first and second anchorages 4, 6 are set on opposite sides with respect to the main body 5a of the suspended region 2 and at a distance from the latter. In particular, without any loss of generality, on the minor sides of the rectangle formed in top plan view by the main body 5a of the suspended region 2. In practice, the first and second anchorages 4, 6 are arranged specularly with respect to the main body 5a of the suspended region 2, along an axis (not shown) parallel to the axis X, which in top plan view divides in an imaginary way the main body 5a into two equal and specular portions.

The first spring 8 has a first end and a second end, which are mechanically fixed, respectively, to the first anchorage 4 and to a corresponding portion of the main body 5a of the suspended region 2. The respective first and second ends of the second spring 9 are mechanically fixed, respectively, to the second anchorage 6 and to a corresponding portion of the main body 5a of the suspended region 2. In practice, in resting conditions (described in greater detail hereinafter), the first and second springs 8, 9 are arranged in a symmetrical way on opposite sides of the main body 5a of the suspended region 2. Furthermore, the first and second springs 8, 9 are elastically deformable, for example, under the action of the acceleration $a_{ext}$ so as to enable the suspended region 2 to translate with respect to the fixed region 3, parallel to the axis X and in both senses. Without any loss of generality, the first and second springs 8, 9 are coplanar with the suspended region 2 and have the same thickness as the latter.

In the example illustrated in FIG. 1, the main body 5a of the suspended region 2 forms a number of (in particular, four) secondary cavities CS, which are the same as one another. Embodiments (not illustrated) are, however, possible where there is present, for example, just one secondary cavity CS, or in any case a number of secondary cavities CS other than four.

Each secondary cavity CS has the shape of a parallelepiped, and hence in top plan view has the shape of a rectangle, and moreover extends throughout the thickness of the main body 5b. Extending within each secondary cavity CS is a corresponding pair of conductive plates, which are referred to hereinafter as "first and second fixed plates 12, 14."

In the example illustrated in FIG. 1, the first fixed plates 12 of the secondary cavities CS are the same as one another and are made of conductive material (for example, doped semiconductor material, such as doped silicon). Likewise, the second fixed plates 14 of the secondary cavities CS are the same as one another and are made of conductive material (for example, doped semiconductor material, such as doped silicon).

In greater detail, in the example illustrated in FIG. 1, given a secondary cavity CS, the respective first and second fixed plates 12, 14 are the same as one another, are arranged facing one another, and are fixed to the aforementioned substrate of the fixed region 3 so as to be fixed with respect to the latter Moreover, the first and second fixed plates 12, 14 are parallel to and face, respectively, a first side wall 16 and a second side wall 18 of the secondary cavity CS, which are opposite to one another and parallel to the plane YZ. In even greater detail, each of the first and second fixed plates 12, 14 may have one and the same height (measured along the axis Z) Moreover, the first and second fixed plates 12, 14 may be arranged vertically (i.e., parallel to the axis Z) in such a way that the respective geometrical centers are located at one and the same height.

From an electrical standpoint, the first fixed plate 12 and the first side wall 16 form a first sensing capacitor, the capacitance of which depends, among other things, upon the distance between the first fixed plate 12 and the first side wall 16. Likewise, the second fixed plate 14 and the second side wall 18 form a second sensing capacitor, the capacitance of which depends, among other things, upon the distance between the second fixed plate 14 and the second side wall 18. It follows that the capacitance of the first and second sensing capacitors depend upon the position of the suspended region 2 with respect to the fixed region 3, and hence upon the acceleration $a_{ext}$ to which the accelerometer 1 is subjected, which will be referred to in what follows as "external acceleration $a_{ext}$".

As described in greater detail hereinafter, the capacitive variations of the first and second sensing capacitors of each secondary cavity CS are used for measuring the external acceleration $a_{ext}$, via a capacitance-to-voltage converter interface. The first and second sensing capacitors of the secondary cavities CS hence form a sensing assembly of a capacitive type.

Once again with reference to FIG. 1, the accelerometer 1 further includes an electrode 20, which will be referred to in what follows as "modulation electrode 20". The modulation electrode 20 is fixed to the substrate of the fixed region 3 and has to a first approximation a U shape, in top plan view. Furthermore, once again in top plan view, the modulation electrode 20 faces, at a distance, one of the major sides of the main body 5a.

Figure 2:
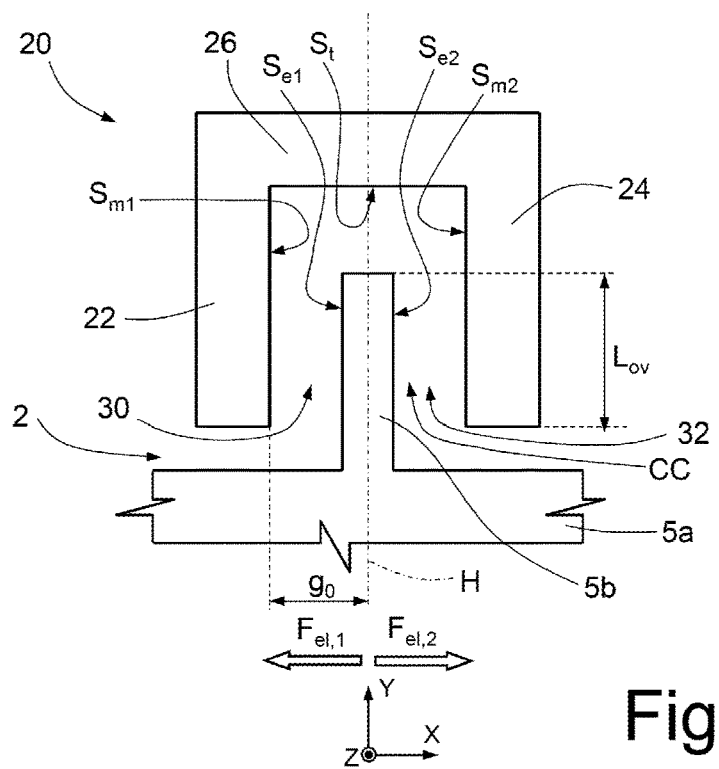
FIG. 2 shows a schematic top plan view of a portion of the embodiment illustrated in FIG. 1.

As shown in greater detail in FIG. 2, in the example illustrated in FIG. 1 the modulation electrode 20 includes a first lateral portion 22 and a second lateral portion 24 and a transverse portion 26, which are monolithic with respect to one another and are fixed with respect to the fixed region 3. Furthermore, the modulation electrode 20 is made of a conductive material, such as, for example, doped semiconductor material (e.g., doped silicon).

Each of the transverse portion 26 and the first and second lateral portions 22, 24 is substantially parallelepipedal in shape. Furthermore, in the example illustrated in FIGS. 1 and 2, the transverse portion 26 and the first and second lateral portions 22, 24 are coplanar and have one and the same thickness, the latter being the same, to a first approximation, as the thickness of the suspended region 2. Without any loss of generality, the modulation electrode 20 may be fixed to the substrate of the fixed region 3 in such a way that, if the maximum and minimum heights of the suspended region 2 are referred to, respectively, as "maximum height" and "minimum height", to a first approximation also the first and second lateral portions 22, 24 extend between the maximum height and the minimum height.

In greater detail, the first and second lateral portions 22, 24 are arranged specularly with respect to a plane H, which is parallel to the plane YZ and represents, in resting conditions, a plane of symmetry of the accelerometer 1. Each of the first and second lateral portions 22, 24 has a pair of side walls parallel to the plane H.

The transverse portion 26 has ends connected to the first and second lateral portions 22, 24 so as to connect them together. Without any loss of generality, in resting conditions, the transverse portion 26 is traversed by the plane H, which divides it into two sub-portions that are the same as one another and specular. As regards the aforementioned resting conditions, they envisage that the accelerometer is not subjected to any external acceleration (i.e., $a_{ext}=0$) and the modulation electrode 20 and the suspended region 2 are set at one and the same voltage.

Once again with reference to the control element 5b, in the example illustrated in FIGS. 1 and 2 it has the shape of a parallelepiped and extends from the main body 5a towards the modulation electrode 20. In particular, in top plan view, the control element 5b extends from the side of the main body 5a that the modulation electrode 20 faces, in the direction of the latter, in a way such as to be arranged between the first and second lateral portions 22, 24 of the modulation electrode 20. In other words, the control element 5b extends at least in part within a cavity CC delimited by the modulation electrode 20, which will be referred to in what follows as "control cavity CC".

In greater detail, the control element 5b is delimited laterally by a pair of walls, which are opposite to one another and parallel to the plane YZ and will be referred to in what follows as "first and second suspended walls $S_{e1}$, $S_{e2}$", these walls facing the first and second lateral portions 22, 24, respectively, of the modulation electrode 20. In turn, the first and second lateral portions 22, 24 of the modulation electrode 20 are delimited, respectively, by a first fixed wall $S_{m1}$ and a second fixed wall $S_{m2}$, which face, respectively, the first and second suspended walls $S_{e1}$, $S_{e2}$, to which they are parallel. In addition, the transverse portion 26 of the modulation electrode 20 is delimited by a further wall $S_t$, which faces the control element 5b and is perpendicular to the first and second fixed walls $S_{m1}$, $S_{m2}$, with which it is in direct contact.

In use, as described in greater detail hereinafter, the first and second fixed walls $S_{m1}$, $S_{m2}$ are equipotential. Likewise, the first and second suspended walls $S_{e1}$, $S_{e2}$ are equipotential.

In practice, the first lateral portion 22 of the modulation electrode 20 and the control element 5b form a capacitor 30, which will be referred to hereinafter as "first control capacitor 30". Likewise, the second lateral portion 24 of the modulation electrode 20 and the control element 5b form a further capacitor 32, which will be referred to hereinafter as "second control capacitor 32".

The capacitance of the first control capacitor 30 depends upon the area of lateral overlapping (i.e., parallel to the axis X) of the first fixed wall $S_{m1}$ and of the first suspended wall $S_{e1}$. In this connection, it may be noted how this area is equal to $L_{ov} \cdot t_{ov}$, where $L_{ov}$ is, as shown in FIG. 2, the length (measured parallel to the axis Y) of the portion of first suspended wall $S_{e1}$ that laterally overlaps the first fixed wall $S_{m1}$, while $t_{ov}$ is the height (measured parallel to the axis Z) of the aforesaid portion and to a first approximation is equal to the thickness of the suspended region 2. Furthermore, the capacitance of the first control capacitor 30 depends upon the distance between the first fixed wall $S_{m1}$ and the first suspended wall $S_{e1}$, which can be expressed as $(g_0+x)$, where $g_0$ is the distance between the aforesaid walls in resting conditions, while x is the variation of the aforesaid distance with respect to the value of $g_0$. In what follows, the quantity x will be referred to also as "deviation".

The capacitance of the second control capacitor 32 depends upon the area of lateral overlapping of the second fixed wall $S_{m2}$ and of the second suspended wall $S_{e2}$, which is once again equal to $L_{ov} \cdot t_{ov}$. Furthermore, the capacitance of the second control capacitor 32 depends upon the distance between the second fixed wall $S_{m2}$ and the second suspended wall $S_{e2}$, which can be expressed as $(g_0-x)$. Consequently, without any loss of generality, in resting conditions, the control element 5b is equidistant from the first and the second fixed wall $S_{m1}$, $S_{m2}$, and the first and second control capacitors 30, 32 have substantially one and the same capacitance.

In use, the modulation electrode 20 is set at a voltage $V_m$, whereas the suspended region 2, and hence also the control element 5b, is set at a voltage $V_{rotor}$. Consequently, on the control element 5b, and hence more in general on the suspended region 2, two electrostatic forces are exerted in one and the same direction, but in opposite senses, these forces being denoted in what follows as $F_{el,1}$ and $F_{el,2}$. In particular, recalling that a capacitor subjected to a voltage $\Delta V_s$ is subjected to an electrostatic force approximately equal to $\frac{1}{2} \cdot (\Delta C / \Delta x) \cdot \Delta V_s^2$ (where $\Delta C$ is variation of capacitance of the capacitor following upon a variation equal to $\Delta x$ of the distance of the respective plates), we have:

$$F_{el,1} = \frac{1}{2} \cdot \frac{\varepsilon_0 L_{ov} t_{ov}}{(g_0 - x)^2} \cdot (V_m - V_{rotor})^2 \quad (1)$$

$$F_{el,2} = -\frac{1}{2} \cdot \frac{\varepsilon_0 L_{ov} t_{ov}}{(g_0 + x)^2} \cdot (V_m - V_{rotor})^2 \quad (2)$$

where $\varepsilon_0$ is the vacuum permittivity.

Assuming, $V_{rotor}=0$ and $x \ll g_0$, i.e., assuming small variations with respect to the resting conditions, it is possible to linearize the expression of the total electrostatic force $F_{el,tot}$ that acts on the suspended region 2, which is:

$$F_{el,tot} = F_{el,1} + F_{el,2} \approx 2 \frac{\varepsilon_0 L_{ov} t_{ov}}{g_0^3} \cdot V_m^2 \cdot x \quad (3)$$

To a first approximation, the total electrostatic force $F_{el,tot}$ is hence linearly proportional to the deviation of the suspended region 2 from the position assumed in resting conditions. Furthermore, the total electrostatic force $F_{el,tot}$ can be understood as a sort of electrostatic stiffness, since it can be expressed as $F_{el,tot} \approx k_{el} \cdot x$, where:

$$k_{el} = 2 \frac{\varepsilon_0 L_{ov} t_{ov}}{g_0^3} \cdot V_m^2 \quad (4)$$

The voltage $V_m$ applied to the modulation electrode 20 can be written as the sum of a constant component $V_{dc}$ and a variable component $\Delta V \cdot \sin(\omega_m t)$, where t, $\omega_m$, and $\Delta V$ are, respectively, the time and the pulsation of the variable (oscillating) component and the corresponding amplitude. In other words, we have:

$$V_m(t) = V_{dc} + \Delta V \cdot \sin(\omega_m t) \quad (5)$$

The following relation consequently applies:

$$F_{el,tot} \approx 2\frac{\varepsilon_0 L_{ov} t_{ov}}{g_0^3} \cdot (V_{dc} + \Delta V \cdot \sin(\omega_m t))^2 \cdot x \quad (6)$$

Assuming that $V_{dc} \gg \Delta V/2$, Eq. (6) can be rewritten as:

$$F_{el,tot} \approx (k_{el,0} + \Delta k \cdot \sin(\omega_m t)) \cdot x \quad (7)$$

where:

$$k_{el,0} \approx 2\frac{\varepsilon_0 L_{ov} t_{ov}}{g_0^3} \cdot V_{dc}^2 \quad (8)$$

$$\Delta k \approx 4\frac{\varepsilon_0 L_{ov} t_{ov}}{g_0^3} \cdot V_{dc} \cdot \Delta V \quad (9)$$

This having been said, the equation that describes the motion of the suspended region 2 can be written as:

$$m\ddot{x} + b\dot{x} + kx = m \cdot a_{ext} + F_{el,tot} \quad (10)$$

where: m is the mass of the suspended region 2; b is the damping (caused by viscous friction); and k is the elastic constant (or stiffness) of the system formed by the suspended region 2 and by the first and second springs 8, 9.

Eq. (10) can be rewritten, to a first approximation, as:

$$m\ddot{x} + b\dot{x} + (k - k_{el,0} - \Delta k \cdot \sin(\omega_m t)) \cdot x = m \cdot a_{ext} \quad (11)$$

In quasi-static approximation, i.e., when the frequency $f_m = \omega_m/2\pi$ is much lower than the mechanical resonance frequency $f_{mech}$ of the system formed by the suspended region 2 and the first and second springs 8, 9, the first two terms in the left-hand member of Eq. (11) may be neglected. Consequently, as regards the deviation x, the following relation applies:

$$x = \frac{m \cdot a_{ext}}{k - k_{el,0} - \Delta k \cdot \sin(\omega_m t)} \quad (12)$$

By linearizing the right-hand member of Eq. (12), i.e., by expanding the right-hand member of Eq. (12) into a first-order series with variable $\Delta k$ (with respect to which the derivative is computed) and around the point $(k-k_{el,0})$, we obtain:

$$x(t) = \frac{a_{ext}(t)}{\omega_{el}^2} \cdot \left(1 - \frac{\Delta k}{k - k_{el,0}} \cdot \sin(\omega_m t)\right) \quad (13)$$

where it is rendered evident that the quantities x and $a_{ext}$ may be variable in time, and where:

$$\omega_{el} = \sqrt{\frac{k - k_{el,0}}{m}} \quad (14)$$

Figure 3:
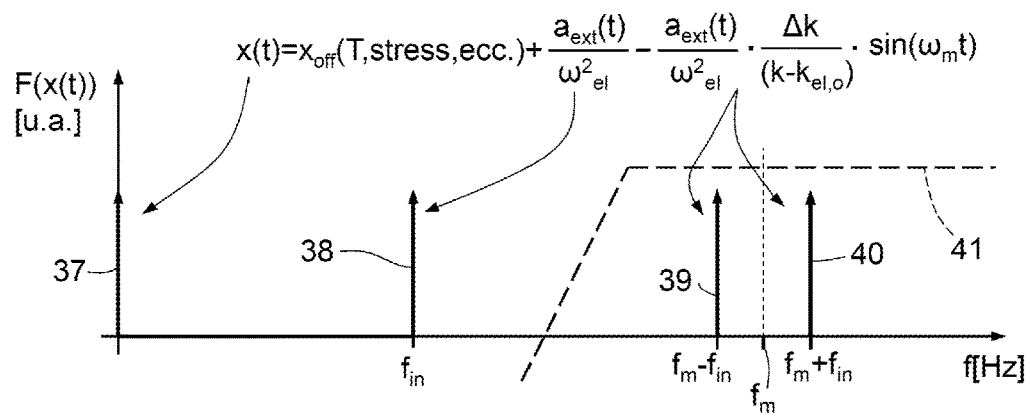
FIG. 3 is a graph illustrating the frequency spectrum of a displacement signal and the corresponding spectral contributions, as well as a frequency response of a high-pass filter according to one embodiment of the present disclosure.

Considering also the undesirable effects, it is thus possible to formulate the following equation:

$$x(t) = x_{off}(T, \text{stresses, etc.}) + \frac{a_{ext}(t)}{\omega_{el}^2} - \frac{a_{ext}(t)}{\omega_{el}^2} \cdot \left(\frac{\Delta k}{k - k_{el,0}} \cdot \sin(\omega_m t)\right) \quad (15)$$

where the first term of the right-hand member ($x_{off}$) is a first contribution to the deviation x, which includes the undesired effects such as, for example, temperature (T), mechanical stresses, etc. Since these undesired effects are very slowly variable in time, the first contribution may be considered as a so-called d.c. contribution, as shown in FIG. 3, where it is designated by 37. The second term of the right-hand member of Eq. (15) represents a second contribution to the deviation x, which depends upon the external acceleration $a_{ext}$, but not upon the pulsation $\omega_m$. The third term of the right-hand member of Eq. (15) represents a third contribution to the deviation x, which depends both upon the external acceleration $a_{ext}$ and upon the pulsation $\omega_m$. In particular, in the frequency domain, the third contribution is translated in frequency with respect to the first and second contributions in a way proportional to the frequency $f_m$, as shown qualitatively in FIG. 3. By way of example, in FIG. 3 it has been assumed that the external acceleration $a_{ext}$ has a sinusoidal plot with frequency $f_{in}$, in which case the aforementioned second contribution is formed by a single spectral line (designated by 38) at the frequency $f_{in}$, whereas the third contribution includes a pair of corresponding spectral lines (designated by 39 and 40) set, respectively, at the frequency $f_m - f_{in}$ and at the frequency $f_m + f_{in}$. Furthermore, FIG. 3 shows qualitatively the transfer function 41 of a high-pass filter described hereinafter.

In order to render the accelerometer 1 insensitive to acoustic vibrations, it is possible to impose $f_m > 20$ kHz, in addition to $f_{mech} > 20$ kHz.

Figure 4:
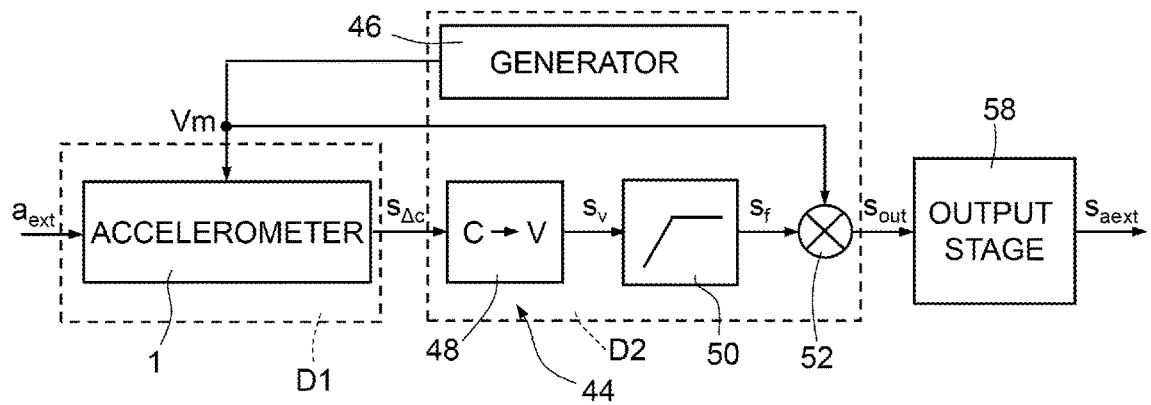
FIG. 4 shows a block diagram of a circuitry for processing a signal supplied by the accelerometer in the embodiment of FIG. 1.

All this having been said, generation of a signal $s_{aext}$ representing the external acceleration $a_{ext}$ can be performed as illustrated in FIG. 4, which shows a processing circuit 44 set downstream of the accelerometer 1, which is represented schematically as a block subjected to the external acceleration $a_{ext}$. In addition, FIG. 4 shows a voltage generator 46, which generates the voltage $V_m$ and is connected to the accelerometer 1 in such a way that, in use, the modulation electrode 20 is set at the voltage $V_m$.

In the example of embodiment of FIG. 4, the processing circuit 44 includes a capacitance-to-voltage converter block 48, a high-pass filter 50, which implements, for example, the transfer function 41 shown in FIG. 3, and a demodulator 52. Without any loss of generality, the accelerometer 1 is formed in a first die D1, whereas the voltage generator 46, the capacitance-to-voltage converter 48, the high-pass filter 50, and the demodulator 52 are provided in a second die, for example, as ASIC. Embodiments (not illustrated) are in any case possible where the accelerometer 1, the voltage generator 46, and the processing circuit 44 are all formed in one and the same die.

In greater detail, the capacitance-to-voltage converter circuit 48 is a connection interface, which is formed, for example, by a charge amplifier of a type in itself known, which is electrically connected to the pairs of sensing capacitors formed in the aforementioned secondary cavities CS of the accelerometer 1 so as to receive a capacitive-variation signal $s_{\Delta C}$ generated by these sensing capacitors, in a way in itself known. On the basis of what has been described previously, the capacitive-variation signal $s_{\Delta C}$ depends upon the deviation x, and hence indicates the value of the latter, since, considering any of the secondary cavities CS, the distance between the respective first fixed plate 12 and the respective first side wall 16 and the distance between the second fixed plate 14 and the second side wall 18 depend upon the deviation x. In addition, the capacitive-variation signal $s_{AC}$ includes respective components, which correspond to the aforementioned first, second, and third contributions of deviation x.

The capacitance-to-voltage converter circuit 48 generates at output a signal to be filtered $s_V$, which is formed, for example, by a voltage that depends upon the capacitance of the sensing capacitors formed in the secondary cavities CS, and hence also indicates the value of the deviation x. In other words, also the signal to be filtered $s_V$ includes respective components, which correspond to the aforementioned first, second, and third contributions of the deviation x.

The signal to be filtered $s_V$ is then filtered by the high-pass filter 50, which generates a filtered signal $s_f$ that depends upon the aforementioned third contribution to the deviation x, but not upon the first and second contributions to the deviation x. In other words, the high-pass filter 50 filters the components of the signal to be filtered $s_V$ that correspond to the first and second contributions of the deviation x.

The filtered signal $s_f$ is supplied on a first input of the demodulator 52, which is of a type in itself known and may include a multiplier and a low-pass filter (not illustrated). Moreover, the voltage generator 46 supplies the voltage $V_m$ on a second input of the demodulator 52, in such a way that the latter supplies an output signal $s_{out}$, which once again indicates the value of the deviation x, but has a lower frequency than the filtered signal $s_f$. For instance, the output signal $s_{out}$ may be in base band.

In practice, the capacitive-variation signal $s_{AC}$ is converted into the signal to be filtered $s_V$ by the capacitance-to-voltage converter 48, is filtered by the high-pass filter 50, and is then demodulated by the demodulator 52. The output signal $s_{out}$ is a function, among other things, of the external acceleration $a_{ext}$, of $V_{dc}$ and $\Delta V$, but not of the pulsation $\omega_m$. Furthermore, the output signal $s_{out}$ may be supplied to an output stage 58, which is formed, for example, by an external device configured to generate an acceleration signal $s_{aext}$ indicating the external acceleration $a_{ext}$, on the basis of the output signal $s_{out}$. The acceleration signal $s_{aext}$ may be of an analog or digital type In this latter case, the output stage 58 may include an A/D converter (not illustrated). In order to configure the output stage 58, it is, for example, possible to carry out operations of calibration in the presence of known accelerations (for example, the acceleration of gravity) so as to determine, for each known acceleration, the corresponding value of the output signal $s_{out}$.

Figure 5:
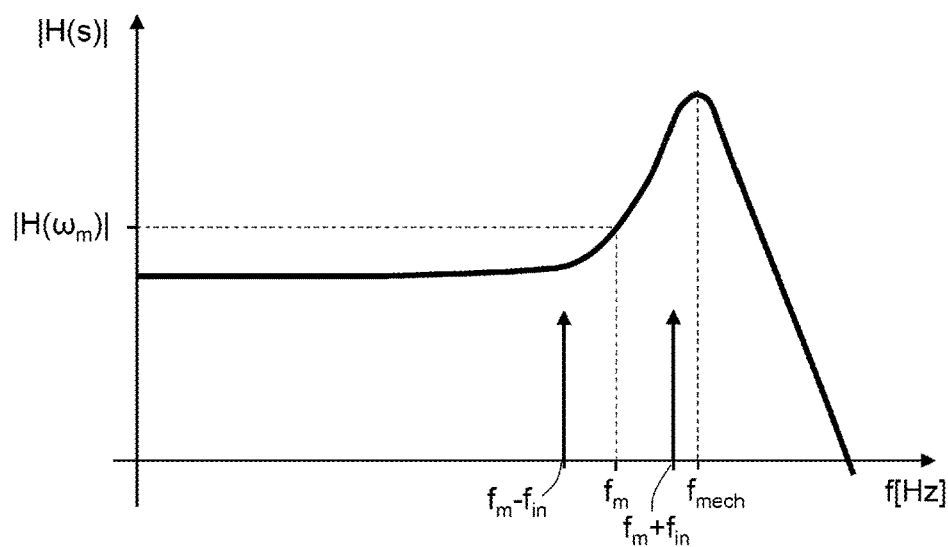
FIG. 5 is a graph illustrating the frequency spectrum of a portion of a displacement signal and the spectrum of a frequency response of a mechanical system of one embodiment of the accelerometer of FIG. 1.

According to a variant illustrated in FIG. 5, in order to increase the amplitude of the output signal $s_{out}$, it is possible to exploit the characteristics of the so-called frequency response H(s) of the mechanical system formed by the suspended region 2 and by the first and second springs 8, 9. As is known, the frequency response H(s) indicates, as a function of the frequency of an external mechanical driving force in sinusoidal regime, the values of amplitude of the corresponding sinusoidal oscillation to which the suspended region 2 is subjected, with respect to the position assumed in resting conditions. In addition, as represented qualitatively in FIG. 5, the frequency response H(s) has a peak at a frequency value equal to the aforementioned mechanical resonance frequency $f_{mech}$.

Unlike the embodiment described previously, where it has been assumed that operation is such that the spectral lines 39 and 40 of the aforementioned third contribution to the deviation x fall in the so-called flat part of the plot of the modulus of the frequency response H(s), i.e., are set at frequencies decidedly lower than the mechanical resonance frequency $f_{mech}$. In FIG. 5 it is assumed to operate closer to the resonance peak of the frequency response H(s). In this case, there are benefits deriving from the dynamic amplification given by the closeness to the resonance conditions. Moreover, downstream of the high-pass filter 50, the filtered signal $s_f$ indicates the following quantity:

$$x(t) = -\frac{a_{ext}(t)}{\omega_{el}^2} \cdot \frac{\Delta k}{k - k_{el,0}} \cdot \sin(\omega_m t) \cdot |H(\omega_m)| \qquad (16)$$

From a more quantitative standpoint, it may be imposed that the frequency $f_m$ belongs to a frequency range that includes the mechanical resonance frequency $f_{mech}$ and is such that the modulus of $H(\omega_m)$ assumes values at least equal, for example, to $|H(0)|+3$ dB.

Figure 6:
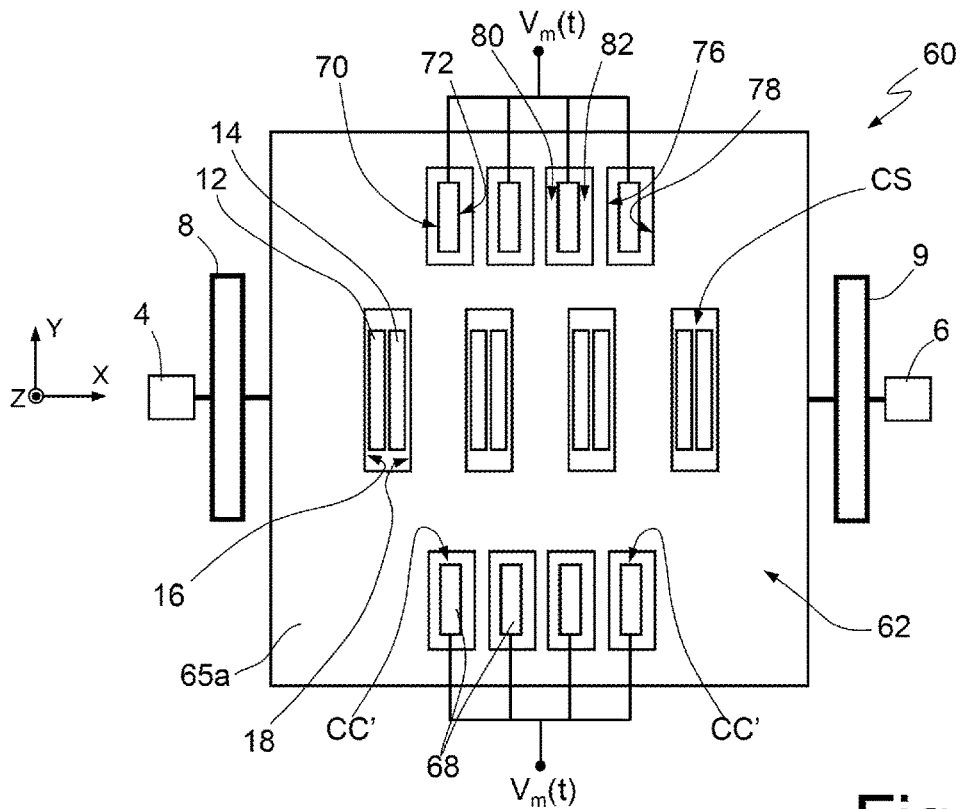
FIGS. 6 and 7 are schematic top plan views of further accelerometers according to embodiments of the present disclosure.

Irrespective of the relative arrangement between the frequency $f_m$ and the mechanical resonance frequency $f_{mech}$, embodiments of the type illustrated in FIG. 6 are possible, where for simplicity of illustration the fixed region 3 is not shown.

In detail, FIG. 6 represents an embodiment of the accelerometer (here designated by 60), which is described with reference to the sole differences with respect to the embodiment shown in FIG. 1. Moreover, elements already present in the embodiment illustrated in FIG. 1 are designated by the same references, except where otherwise specified.

In greater detail, the suspended region (here designated by 62) once again includes the main body, here designated by 65a, but does not include the control element.

The main body 65a forms, in addition to the secondary cavities CS, a plurality of control cavities, here designated by CC'. Purely by way of example, the control cavities CC' are the same as one another, have the shape of a parallelepiped, and extend throughout the thickness of the main body 65a In top plan view, each control cavity CC' hence has the shape of a rectangle.

More in particular, in the embodiment illustrated in FIG. 6 eight control cavities CC' are present, divided into two sets of four, the two sets being arranged specularly with respect to an imaginary axis parallel to the axis X. In practice, each set extends on opposite sides with respect to the set of the secondary cavities CS, which are arranged evenly spaced apart along an axis parallel to the axis X Moreover, in each set, the control cavities CC' are also arranged evenly spaced apart along a respective axis parallel to the axis X, for example, with a spacing smaller than the spacing of the secondary cavities CS. Embodiments (not shown) are, however, possible where each of the two sets is formed by a different number of control cavities CC' and/or just one set is present. Furthermore, it is possible for the main body 65a to form a single control cavity CC', even though in this case the accelerometer 60 is no longer symmetrical.

The accelerometer 60 further includes a plurality of modulation electrodes, here designated by 68, which are the same as one another, are made of conductive material (for example, doped semiconductor material), and have the shape of parallelepipeds. In use, the modulation electrodes 68 are set at the voltage $V_m$, whereas the suspended region 62 is set at the voltage $V_{rotor}$.

Considering any one of the modulation electrodes 68, it extends in a corresponding control cavity CC' and, as already described with reference to the embodiment illustrated in FIG. 1, is fixed to the substrate of the fixed region 3. In addition, each modulation electrode 68 is delimited by a first side wall 70 and a second side wall 72, which are opposite to one another and parallel to the plane YZ, and face at a distance, respectively, a first side wall 76 and a second side wall 78 of the corresponding control cavity CC', which are also opposite to one another and parallel to the plane YZ. Consequently, the first side wall 70 of the modulation electrode 68 forms, together with the first side wall 76 of the corresponding control cavity CC', a corresponding capacitor 80, which will be referred to once again as "first control capacitor", since it performs the same function as the first control capacitor 30 of the embodiment illustrated in FIG. 1. Furthermore, the second side wall 72 of the modulation electrode 68 forms, together with the second side wall 78 of the corresponding control cavity CC', a corresponding capacitor 82, which will be referred to once again as "second control capacitor", since it performs the same function as the second control capacitor 32 of the embodiment illustrated in FIG. 1. In addition, in use, the first and second side walls 70, 72 of the modulation electrode 68 are both at the voltage $V_m$. The first and second side walls 76, 78 of the corresponding control cavity CC' are both at the voltage $V_{rotor}$.

Without any loss of generality, in resting conditions, the distance between the first side wall 70 of the modulation electrode 68 and the first side wall 76 of the corresponding control cavity CC' and the distance between the second side wall 72 of the modulation electrode 68 and the second side wall 78 of the corresponding control cavity CC' are the same as one another, and the first and second control capacitors 80, 82 have capacitances that are the same as one another. Furthermore, to the accelerometer 60 there can be applied the equations mentioned with reference to the embodiment illustrated in FIGS. 1 and 2, after prior adaptation to the change in geometrical conditions.

In practice, the accelerometer 60 envisages a plurality of modulation electrodes 68, and hence a plurality of first control capacitors 80, which are electrically coupled to corresponding second control capacitors 82. Moreover, each modulation electrode 68 is surrounded by the suspended region 62. However, operation of the accelerometer 60 is similar to that of the accelerometer 1.

Figure 7:
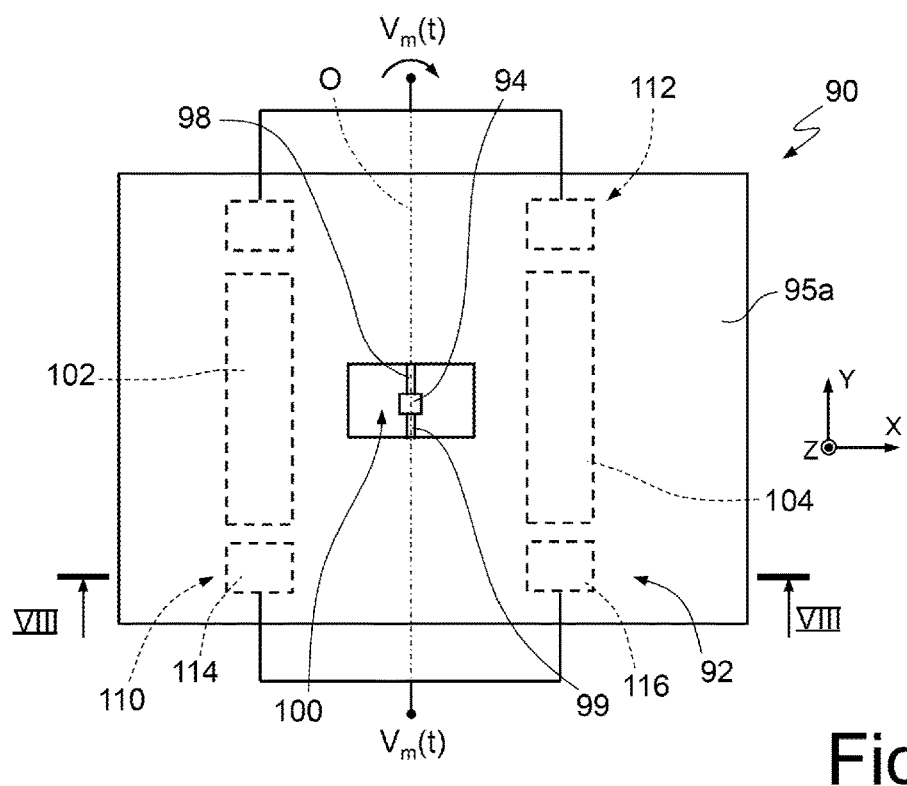
Figure 8:
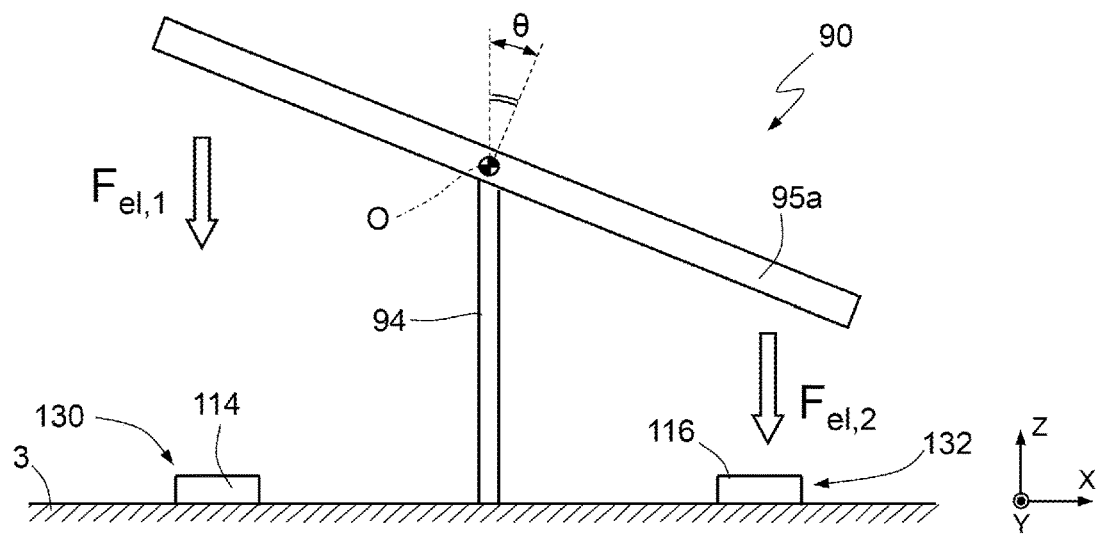
FIG. 8 is a schematic cross-sectional view of a portion of the embodiment illustrated in FIG. 7, taken along the plane of section VIII-VIII of FIG. 7.

FIGS. 7-8 show a further embodiment of the accelerometer, here designated by 90. According to this embodiment, the accelerometer 90 is designed to detect an external acceleration directed parallel to the axis Z. For greater clarity, FIG. 8 illustrates also the first anchorage 94.

In detail, the accelerometer 90 includes the suspended region, here designated by 92, which is constrained to the fixed region 3 (not visible in FIG. 7) via the first anchorage, here designated by 94, as well as via the first and second springs, here designated by 98 and 99, which are of the type that is deformable in rotation, i.e., they operate in torsion.

In greater detail, the suspended region 92 includes the main body, here designated by 95a, but not the control element.

The anchorage 94 extends in an opening 100 in the suspended region 92, which extends throughout the thickness of the latter. The first and second springs 98, 99 are coplanar to the suspended region 92 and extend through the opening 100, parallel to the axis Y, between the first anchorage 94 and two respective opposite points of a portion of main body 95a that delimits the opening 100. In a way in itself known, the first anchorage 94 and the first and second springs 98, 99 are here shaped so as to enable rotation of the suspended region 92 only about an axis of rotation O, parallel to the axis Y. In practice, in the course of rotation, portions of the suspended region 92 exit from the plane of the sheet. In this connection, rotation is due to the fact that the suspended region 92 is asymmetrical with respect to the axis of rotation O. In particular, the axis of rotation O is eccentric with respect to the barycenter (not shown) of the suspended region 92, i.e., the axis of rotation O is shifted with respect to the barycenter by a non-zero arm, which is parallel to the axis Y.

The accelerometer 90 further includes a first fixed plate and a second fixed plate, here designated by 102 and 104, which are fixed to the substrate of the fixed region 3 and are arranged parallel to the plane XY. Since the suspended region 92 overlies the first and second fixed plates 102, 104, it forms with the latter, respectively, a first sensing capacitor and a second sensing capacitor, the capacitances of which depend upon the angle θ, which indicates the degree of rotation of the suspended region 92 with respect to the position assumed in resting conditions, the latter position being parallel to the plane XY. Without any loss of generality, in resting conditions, the first and second sensing capacitors may have approximately one and the same capacitance. Once again without any loss of generality, in top plan view the first and second fixed plates 102, 104 may have the shape of rectangles elongated in a direction parallel to the axis Y and arranged specularly with respect to the first anchorage 94.

The accelerometer 90 further includes a first pair of electrodes 110 and a second pair of electrodes 112, these pairs being the same as one another and being arranged specularly with respect to an imaginary axis parallel to the axis X and passing, in top plan view, through the first anchorage 94. Embodiments are, however, possible where the second pair of electrodes 112 is absent. Moreover, since the first and second pairs of electrodes 110, 112 are the same as one another, in what follows only the first pair of electrodes 110 will be described.

In detail, the first pair of electrodes 110 includes a first modulation electrode 114 and a second modulation electrode 116, which, without any loss of generality, are the same as one another and are formed by corresponding plates parallel to the plane XY, fixed to the substrate of the fixed region 3. In top plan view, the first and second modulation electrodes 114, 116 are equidistant from the axis of rotation O.

The suspended region 92 is arranged on top of, and at a distance from, the first and second modulation electrodes 114 and 116 and forms with the latter, respectively, the first and second control capacitors, here designated by 130 and 132. The values of capacitance of the first and second control capacitors 130, 132 also depend upon the angle θ. Without any loss generality, in resting conditions, the first and second control capacitors 130, 132 may have one and the same value of capacitance.

In use, the first and second pairs of electrodes 110, 112 are set at the voltage $V_m$, whereas the suspended region 92 is set at the voltage $V_{rotor}$. Consequently, on the suspended region 92 there are exerted the two electrostatic forces $F_{el,1}$ and $F_{el,2}$, which cause application to the suspended region 92 of two corresponding coupling that tend to cause the suspended region 92 to turn in opposite directions.

It may hence be shown that the following equations apply:

$$J\ddot{\theta}+b\dot{\theta}+k\theta=m \cdot a_{ext} \cdot r + F_{el,tot} \cdot r_{el} \qquad (17)$$

wherein J is the rotational moment of inertia of the suspended region 92; b is the damping (caused by viscous friction); and k is the elastic stiffness of the system formed by the suspended region 92 and by the first and second springs 98, 99; r is the aforementioned mechanical arm, i.e., the arm defined by the barycenter of the suspended region 92 and by the axis of rotation O; $r_{el}$ is the electrostatic arm, which is equal to the distance from the axis of rotation O of the center of either of the first and second modulation electrodes 114, 116.

This having been said, it may be shown that the following relation applies:

$$\theta(t) = \frac{m \cdot a_{ext}(t)}{k - k_{el,0}} \left( 1 - \frac{\Delta k}{k - k_{el,0}} \cdot \sin(\omega_m t) \right) \quad (18)$$

It follows that operation of the accelerometer 90 is equivalent to what has been described with reference to the accelerometer 1.

In practice, the embodiments previously described envisage the presence of at least two control capacitors, each of which has a fixed plate, fixed with respect to the fixed plate of the other control capacitor and to the fixed region, and a mobile plate, fixed with respect to the mobile plate of the other control capacitor and to the suspended region, the capacitances of the two control capacitors varying with opposite sign following upon the (translational or rotational) movement of the suspended region with respect to the fixed region.

Figure 9:
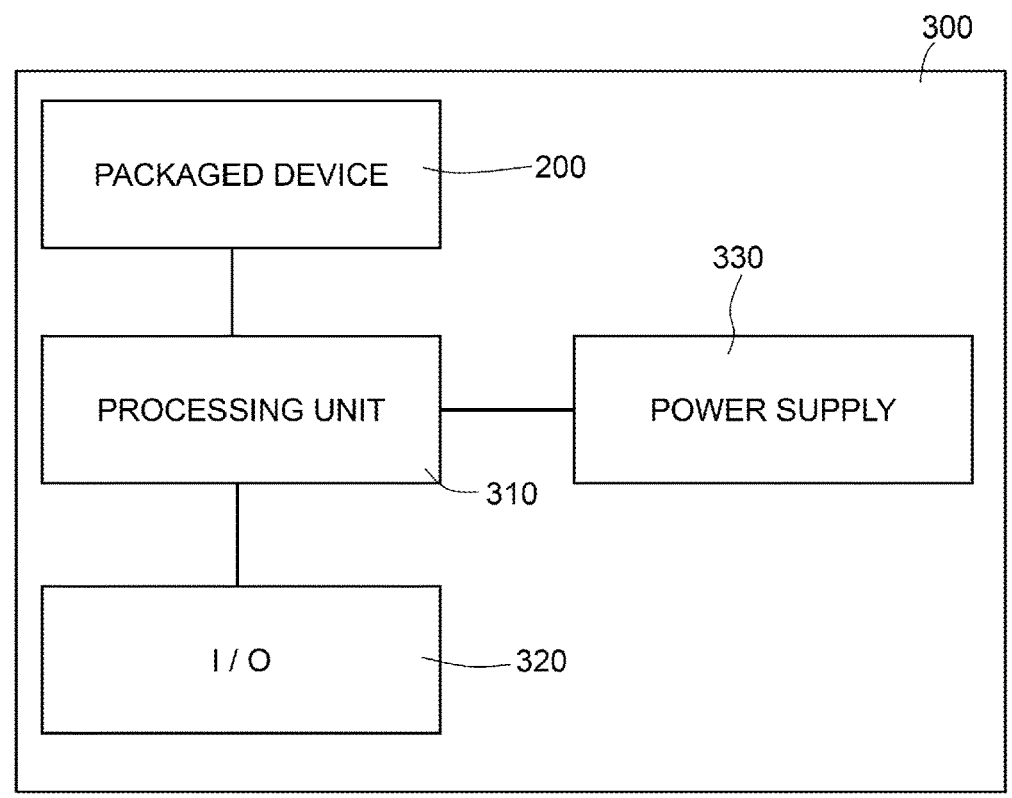
FIG. 9 is a block diagram of an electronic apparatus including one or more accelerometers of FIGS. 1, 6 and 7 according to another embodiment of the present disclosure.

FIG. 9 shows a block diagram of an electronic device 300, which includes an accelerometer, such as one of the accelerometers 1, 60, 90, referred to herein, as packaged device 200. The accelerometer may be used, for example, for detecting vibrations, for determining the orientation of the electronic device 300, or for recognizing free-fall conditions.

The electronic device 300 may be a mobile communication apparatus, such as a cellphone or a personal digital assistant, a portable computer, a photographic-camera or video-camera device, a wearable device, such as a smartwatch, or any other electronic device. The electronic device 300 includes a processing unit 310, which is electrically coupled to the packaged device 200. The processing unit 310 includes a control circuitry, formed, for example, by one or more processors, discrete memory and logic, including the output stage 58 illustrated in FIG. 4. The processing unit 310 is configured for transmitting and receiving signals to/from the packaged device 200. The electronic device 300 may further include an input/output device 320, such as a keypad or a display coupled to the processing unit 310. The electronic device 300 may moreover include a power supply 330, which may be formed by a battery or by components for coupling to an external supply source.

The accelerometer described enables detection of external accelerations in a very accurate way, thanks to the possibility of eliminating the d.c. components, or in any case low-frequency components, that adversely affect the stability and precision of measurement.

In addition, the present accelerometer can be set in the same cavity as that of a gyroscope, in the case where an apparatus envisages both devices, enabling a reduction of the space occupied. In addition, the present accelerometer does not require the presence of any driving circuit designed to keep mechanical parts in oscillation, with consequent reduction of the complexity of implementation.

Finally, it is clear that modifications and variations may be made to the accelerometer described and illustrated herein, without thereby departing from the sphere of protection of the present disclosure, as defined in the annexed claims.

For instance, the shape of the suspended region may be different from the one described, as likewise the number and arrangement of the sensing capacitors, and hence also the shapes and arrangements of the conductive elements that form the corresponding plates. For instance, as mentioned previously, the number and shapes of the secondary cavities may be different from what has been described. Likewise, also the shape and arrangement of the control element (if present) and the shapes and arrangements of one or more of the modulation electrodes described previously may be different Consequently, also the shapes and arrangements of one or more of the control cavities (if present) may be different from what has been described previously.

In addition, even though the embodiments previously described envisage substantially the presence of at least two control capacitors, and hence the presence of two pairs of surfaces (plates), the surfaces of each pair facing one another, embodiments (not shown) are in any case possible corresponding to embodiments described previously, but where a single control capacitor is present, the first and second plates of which are formed, respectively, by the modulation electrode and by the suspended region. For instance, with reference to the embodiment that corresponds to the embodiment illustrated in FIGS. 1 and 2, it differs from the latter because the second lateral portion 24 of the modulation electrode 20 is absent. Consequently, we find $F_{el,tot} = F_{el,1}$, with consequent modification of the equations presented previously. Once again purely by way of example, with reference to the embodiment that corresponds to the embodiment illustrated in FIGS. 7 and 8, it differs from the latter because the second pair of electrodes 112 and the second modulation electrode 116 are absent. Once again, even though in the embodiments previously described the at least two control capacitors have plates that are two by two equipotential, embodiments are possible where this condition is not respected, even though this may lead to an increase in the complexity of the mathematical formulas presented previously. Furthermore, even though the embodiments described previously envisage that, between the four plates of the at least two control capacitors, at least two of these four plates are formed by one and the same component of the accelerometer (for example, the control element 5b), embodiments are possible (not shown) where each plate is formed by a corresponding component of the accelerometer.

As regards the voltage $V_m$, it may even be without any d.c. component, in which case modulation of the stiffness will occur at a frequency that is twice the frequency $f_m$. In this connection, irrespective of the possible presence of the d.c. component, the a.c. component of the voltage $V_m$ may be different from a sinusoid, provided that it remains periodic. For instance, the voltage $V_m$ may be formed by a square wave, in which case a so-called chopping technique is implemented. In general, the processing circuit 44 and/or the output stage 58 may vary as a function of the time plot of the voltage $V_m$.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A portable electronic device, comprising:
an accelerometric sensor including:
an axis of rotation;
a fixed region;
a suspended region of semiconductor material that is rotatable relative to the fixed region about the axis of rotation, the suspended region overlaps the fixed region and is suspended over the fixed region, the suspended region includes a first surface that faces away from the fixed region, a second surface that faces towards the fixed region, is opposite to the first surface and is closer to the fixed region than the first surface, a first sidewall, a second sidewall that is opposite to the first sidewall, the first and second sidewalls extend from the first surface to the second surface and are transverse to the axis of rotation, and an opening that extends through the suspended region from the first surface to the second surface;
a central anchor along the axis rotation, the central anchor is coupled to the fixed region, is coupled to the suspended region, and has an end within the opening;
a first, second, third, and fourth modulation electrode are attached to the fixed region and configured to receive an electrical modulation signal including at least one periodic component having a first frequency, the first and second modulation electrodes are positioned closer to the first sidewall than the second sidewall, and the third and fourth modulation electrodes are positioned closer to the second sidewall than the first sidewall;
a first, second, third, and fourth variable capacitor are formed by the suspended region and the first, second, third, and fourth modulation electrodes to provide one or more electrostatic forces to the suspended region based on the electrical modulation signal; and
a first and second sensing electrode are attached to the fixed region, the first sensing electrode is aligned with the first and second modulation electrodes and is between the first and second modulation electrodes, and the second sensing electrode is aligned with the second and fourth modulation electrodes and is between the second and fourth modulation electrodes,
wherein the suspended region fully overlaps the first, second, third, and fourth modulation electrodes and fully overlaps the first and second sensing electrodes; and
a processing unit electrically coupled to the accelerometric sensor.

2. The portable electronic device of claim 1, further comprising an input/output device coupled to the processing unit, the input/output device including a keypad and a display.

3. The portable electronic device of claim 2, wherein the processing unit includes at least one of a cellphone, personal digital assistant, portable computer, photographic-camera, video-camera, or wearable device circuitry.

4. The portable electronic device of claim 1, wherein the processing unit further comprises:
a capacitance-to-voltage converter configured to receive an electrical sensing signal and configured to generate an output voltage signal having a value indicating a value of the first variable capacitor;
a high-pass filter coupled to the capacitance-to-voltage converter to receive the output voltage signal; and
a demodulator coupled to the high-pass filter to receive the filtered output signal and configured to receive the electrical modulation signal, the demodulator configured to generate a demodulated output signal indicating a deviation of the suspended region with a frequency that is different than a frequency of the output voltage signal from the capacitance-to-voltage converter.

5. The portable electronic device of claim 1, further comprising a first spring within the opening in the suspended region and a second spring in the opening of the suspended region, and wherein the end of the central anchor is coupled to the suspended region by the first and second springs.

6. The portable electronic device of claim 5, wherein:
the axis of rotation is transverse to a central axis of the central anchor.

7. The portable electronic device of claim 1, wherein:
the first sensing electrode is further away from the first sidewall than the first and second modulation electrodes and is further away from the second sidewall than the third and fourth modulation electrodes; and
the second sensing electrode is further away from the first sidewall than the first and second modulation electrodes and is further away from the second sidewall than the third and fourth modulation electrodes.

8. The portable electronic device of claim 1, wherein:
the first and second modulation electrodes are aligned with each other;
the third and fourth modulation electrodes are aligned with each other; and
the first and second sensing electrodes are aligned with each other.

9. The portable electronic device of claim 1, wherein the first modulation electrode, the second modulation electrode, the third modulation electrode, and the fourth modulation electrode are equidistant from the axis of rotation.

10. A method, comprising:
detecting an acceleration using an accelerometric sensor, the detecting including:
biasing first, second, third, and fourth modulation electrodes with an electrical modulation signal having a first frequency, the first, second, third, and fourth modulation electrodes being fixed relative to a bearing structure;
capacitively coupling the first, second, third, and fourth modulation electrodes to a suspended region that fully overlaps the first, second, third, and fourth modulation electrodes so as to generate first, second, third, and fourth electrostatic forces that are applied to the suspended region, the first, second, third, and fourth electrostatic forces being based on the electrical modulation signal, the suspended region includes a first surface that is opposite to a second surface and a first sidewall that is opposite to a second sidewall, the first and second sidewalls extending between the first and second surfaces, the first surface faces away from the bearing structure, the second surface faces towards the bearing structure, the first and second modulation electrode are closer to the first sidewall than the second sidewall and than the third and fourth modulation electrode are to the first sidewall, and the third and fourth modulation electrode are closer to the second sidewall than the first sidewall and than the first and second modulation electrode are to the second sidewall; and
generating an electrical sensing signal with a first and second sensing electrode attached to the bearing structure, the first sensing electrode being between the first third modulation electrode and is aligned with the first and third modulation electrode, the second sensing electrode is between the second and fourth modulation electrode and is aligned with the second and fourth modulation electrode, the first and second sensing electrode being responsive to the bearing structure and suspended region experiencing an acceleration, the suspended region being rotatable relative to the bearing structure about an axis of rotation that passes through a central anchor and is transverse to the first and second sidewalls and the electrical sensing signal indicating a position of the suspended region relative to the bearing structure and the electrical signal including a frequency-modulated component that is a function of the acceleration and a function of the first frequency of the electrical modulation signal; and processing the electrical sensing signal using a processing unit electrically coupled to the accelerometric sensor.

11. The method according to claim 10, wherein processing the electrical sensing signal includes:

generating, based on the electrical sensing signal, an electrical signal to be filtered, the electrical signal to be filtered including a number of respective components, one of the respective components being a function of the frequency-modulated component; and filtering a d.c. component of the electrical signal to be filtered to thereby generate an electrical signal to be demodulated.

12. The method according to claim 11, wherein processing the electrical sensing signal includes generating, starting from the electrical signal to be demodulated, a demodulated output signal that indicates the acceleration and is at a frequency lower than the frequency of the frequency-modulated component.

13. The method according to claim 10, wherein generating the electrical sensing signal includes generating the electrical sensing signal based on signals received from the first and second sensing electrode.

14. The method of claim 10, wherein the first modulation electrode, the second modulation electrode, the third modulation electrode, and the fourth modulation electrode are equidistant from the axis of rotation.

15. A portable electronic device, comprising:
an accelerometric sensor including;
an axis of rotation;
a fixed region;
a suspended region of semiconductor material that is rotatable relative to the fixed region, the suspended region including a first surface, a second surface opposite to the first surface, a first sidewall, a second sidewall opposite to the first sidewall, the first and second sidewalls extend from the first surface to the second surface and are transverse to the axis of rotation, and a central opening that extends through the suspended region from the first surface to the second surface;
a central anchor along the axis of rotation, the central anchor is coupled to the fixed region, is coupled to the suspended region, and has an end within the central opening;
a first, second, third, and fourth modulation electrode are attached to fixed region, the suspended region fully overlying the first, second, third, and fourth modulation electrodes, the first and second modulation electrodes are closer to the first sidewall than the second sidewall, and the third and fourth modulation electrodes are closer to the second sidewall than the first sidewall;
elastic suspension elements coupling the suspended region to the end of the central anchor;
a first variable capacitor formed by the suspended region and the first modulation electrode to provide a first electrostatic force to the suspended region based on an electrical modulation signal;
a second variable capacitor formed by the suspended region and the second modulation electrode to provide a second electrostatic force to the suspended region based on the electrical modulation signal;
a third variable capacitor formed by the suspended region and the third modulation electrode to provide a third electrostatic force to the suspended region based on the electrical modulation signal;
a fourth variable capacitor formed by the suspended region and the fourth modulation electrode to provide a fourth electrostatic force to the suspended region based on the electrical modulation signal; and
a first and second sensing electrode are attached to the fixed region, the central anchor being between the first and second sensing electrodes, the first and third modulation electrode being aligned with the first sensing electrode and the second and fourth modulation electrode being aligned with the second sensing electrode, the first sensing electrode is between the first and third modulation electrode, the second sensing electrode is between the second and fourth modulation electrode, and the suspended region fully overlaps the first and second sensing electrodes; and
a processing unit electrically coupled to the accelerometric sensor.

16. The portable electronic device of claim 15, wherein the processing unit comprises:

a capacitance-to-voltage converter configured to receive an electrical sensing signal and configured to generate an output voltage signal having a value indicating a value of the first variable capacitor;

a high-pass filter coupled to the capacitance-to-voltage converter to receive the output voltage signal; and a demodulator coupled to the high-pass filter to receive the filtered output signal and configured to receive the electrical modulation signal, the demodulator configured to generate a demodulated output signal indicating a deviation of the suspended region but having a frequency that is different than a frequency of the output voltage signal from the capacitance-to-voltage converter.

17. The portable electronic device of claim 15, further comprising an input/output device coupled to the processing unit, the input/output device including a keypad and a display.

18. The portable electronic device of claim 15, wherein the processing unit includes at least one of a cellphone, personal digital assistant, portable computer, photographic-camera, video-camera, or wearable device circuitry.

19. The portable electronic device of claim 15, wherein the elastic suspension elements are within the central opening, extend through the central opening between the end of the central anchor and opposite points of a portion of the suspended region that delimits the central opening, and are aligned along the axis of rotation about the suspended region rotates.

20. The portable electronic device of claim 19, wherein:
the first and second modulation electrodes are aligned with each other;
the third and fourth modulation electrodes are aligned with each other; and
the first and second sensing electrodes are aligned with each other.

21. The portable electronic device of claim 15, wherein the first modulation electrode, the second modulation electrode, the third modulation electrode, and the fourth modulation electrode are equidistant from the axis of rotation.

* * * * *

UNITED STATES PATENT AND TRADEMARK OFFICE
CERTIFICATE OF CORRECTION

| | |
|---|---|
| PATENT NO. | : 11,835,541 B2 |
| APPLICATION NO. | : 16/781963 |
| DATED | : December 5, 2023 |
| INVENTOR(S) | : Alessandro Tocchio et al. |

It is certified that error appears in the above-identified patent and that said Letters Patent is hereby corrected as shown below:

In the Claims

<u>Column 17, Claim 10, Lines 1 and 2:</u>
"between the first third modulation" should read: -- between the first and third modulation --.

Signed and Sealed this
Twentieth Day of February, 2024

*Katherine Kelly Vidal*

Katherine Kelly Vidal
*Director of the United States Patent and Trademark Office*